United States Patent
Chamberlin et al.

(10) Patent No.: US 10,194,537 B2
(45) Date of Patent: Jan. 29, 2019

(54) MINIMIZING PRINTED CIRCUIT BOARD WARPAGE

(71) Applicant: International Business Machines Corporation, Armonk, NY (US)

(72) Inventors: Bruce J. Chamberlin, Vestal, NY (US); Joseph Kuczynski, Rochester, MN (US); Paula M. Nixa, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 1440 days.

(21) Appl. No.: 13/849,580

(22) Filed: Mar. 25, 2013

(65) Prior Publication Data

US 2014/0285979 A1 Sep. 25, 2014

(51) Int. Cl.
H05K 3/00 (2006.01)
H05K 3/46 (2006.01)
H05K 3/30 (2006.01)

(52) U.S. Cl.
CPC . *H05K 3/4611* (2013.01); *H05K 2201/09136* (2013.01); *H05K 2203/068* (2013.01)

(58) Field of Classification Search
CPC .. H05K 1/0271; H05K 3/4611; H05K 3/4688; H05K 3/4602; H05K 3/4644
USPC .................................. 29/887, 829, 832, 846
See application file for complete search history.

(56) References Cited

U.S. PATENT DOCUMENTS

| | | | | |
|---|---|---|---|---|
| 5,768,108 A * | 6/1998 | Miura | ................. | H01L 21/4857 174/256 |
| 6,708,404 B1 * | 3/2004 | Gaku | .................... | H05K 3/0038 29/852 |
| 6,949,404 B1 | 9/2005 | Fritz et al. | | |
| 7,526,863 B2 * | 5/2009 | Miyagawa | ............. | B41J 2/1603 216/27 |
| 8,376,922 B2 * | 2/2013 | Akama | .............. | G03G 15/0818 29/895 |
| 2004/0014317 A1 * | 1/2004 | Sakamoto | ............. | H01L 21/568 438/689 |
| 2004/0070643 A1 * | 4/2004 | Kubota | .................. | B41J 2/1404 347/20 |
| 2004/0194303 A1 | 10/2004 | Kim et al. | | |
| 2005/0087747 A1 * | 4/2005 | Yamada | ................... | G02B 6/43 257/80 |
| 2006/0029811 A1 * | 2/2006 | Sugioka | .................. | C08L 61/28 428/413 |
| 2007/0284034 A1 * | 12/2007 | Fathi | ...................... | B29C 65/04 156/273.9 |

(Continued)

FOREIGN PATENT DOCUMENTS

JP   2000108150 A   4/2000
JP   2008114580 A   5/2008

(Continued)

*Primary Examiner* — Peter DungBa Vo
*Assistant Examiner* — Kaying Kue
(74) *Attorney, Agent, or Firm* — Isaac J. Gooshaw

(57) ABSTRACT

A printed circuit board and method of manufacturing same, the printed circuit board comprising a stack of layers. The stack of layers being comprised of alternating circuit layers and insulating layers that are laminated together. The stack of layers includes an area with resin cured to a degree. The area has a coefficient of thermal expansion that is dependent, at least in part, on the degree of curing of the resin.

14 Claims, 4 Drawing Sheets

(56) References Cited

U.S. PATENT DOCUMENTS

| | | | |
|---|---|---|---|
| 2009/0250251 A1* | 10/2009 | Shibata | H01L 21/4832 |
| | | | 174/255 |
| 2010/0012955 A1* | 1/2010 | Sorg | H01L 24/24 |
| | | | 257/88 |
| 2011/0278742 A1* | 11/2011 | Schelle | H01L 23/291 |
| | | | 257/784 |
| 2011/0315887 A1* | 12/2011 | Inoue | G01T 1/2018 |
| | | | 250/369 |
| 2012/0018194 A1* | 1/2012 | Maeda | H05K 3/0035 |
| | | | 174/251 |
| 2012/0081872 A1 | 4/2012 | Brown et al. | |
| 2012/0154982 A1* | 6/2012 | Ota | H01G 9/012 |
| | | | 361/502 |
| 2012/0207972 A1 | 8/2012 | Kim et al. | |
| 2012/0235303 A1 | 9/2012 | Liu et al. | |
| 2012/0286417 A1 | 11/2012 | Lin et al. | |
| 2012/0319255 A1 | 12/2012 | Zhong et al. | |
| 2014/0311086 A1* | 10/2014 | Braun | B32B 5/18 |
| | | | 52/783.1 |
| 2015/0004327 A1* | 1/2015 | Yamamoto | G06F 3/041 |
| | | | 427/535 |

FOREIGN PATENT DOCUMENTS

| | | |
|---|---|---|
| KR | 1020110053828 A | 5/2011 |
| WO | 0057680 A1 | 9/2000 |

* cited by examiner

MINIMIZING PRINTED CIRCUIT BOARD WARPAGE

FIELD OF THE INVENTION

The present invention relates generally to the field of printed circuit board structure, and more particularly to minimizing warpage of printed circuit boards.

BACKGROUND OF THE INVENTION

A wide variety of semiconductor packages having integrated circuits mounted to printed circuit boards are now used in many products. Technological advances in integrated circuit (IC) materials and design have produced generations of ICs where each generation has smaller and more complex circuits than the previous generation. Concurrent with the change in size and complexity, has been an increase in the number of connections from the integrated circuit to the larger electronics assembly, including the printed circuit board.

One of the current packaging processes for ICs employs "flip chip" technology, where an IC is flipped and bonded to a carrier substrate, such as a printed circuit board (PCB). Often, the input and output connections between an IC and carrier substrate are created using a ball grid array (BGA). The input and output connections conduct electrical signals from the integrated circuit to the printed circuit board in which or on which the IC package is associated.

BGA packaging offers advantages, such as improved heat conduction due to the lower thermal resistance between the package and PCB, a lower inductance connection than pins, and reduced solder connection bridging. As a result, BGA packaging has become a favorite packaging type for many manufactures. Typically, during assembly of a ball grid array (BGA), an IC package and printed circuit board (PCB) are heated, causing solder balls to melt and solder the IC package to the PCB.

In general, the solder connections between a BGA and a PCB require tight mechanical tolerances during processing in order to preclude mechanical stresses which would promote solder joint failure. However, temperature fluctuations and the design of a given PCB may result in excessive thermal stress, which may then lead to warpage of the PCB. To counter the possibility of warpage, most PCBs are designed symmetrically, but this imposes many design limitations. Typically, if a PCB is found to have undesirable degrees of warpage, then the PCB can not be used. As a result, PCB warpage can quickly increase costs of production since PCBs are usually produced in batches.

SUMMARY

Exemplary embodiments of the present invention disclose the structure of a printed circuit board with minimized warpage and a method of manufacturing same. The printed circuit board comprising a stack of layers, the stack of layers being comprised of alternating circuit layers and insulating layers that are laminated together. The stack of layers includes an area with resin cured to a degree. The area has a coefficient of thermal expansion that is dependent, at least in part, on the degree of curing of the resin.

BRIEF DESCRIPTION OF THE SEVERAL VIEWS OF THE DRAWINGS

In the drawings, wherein like reference characters denote similar elements throughout the several views.

DETAILED DESCRIPTION

Figure 1:
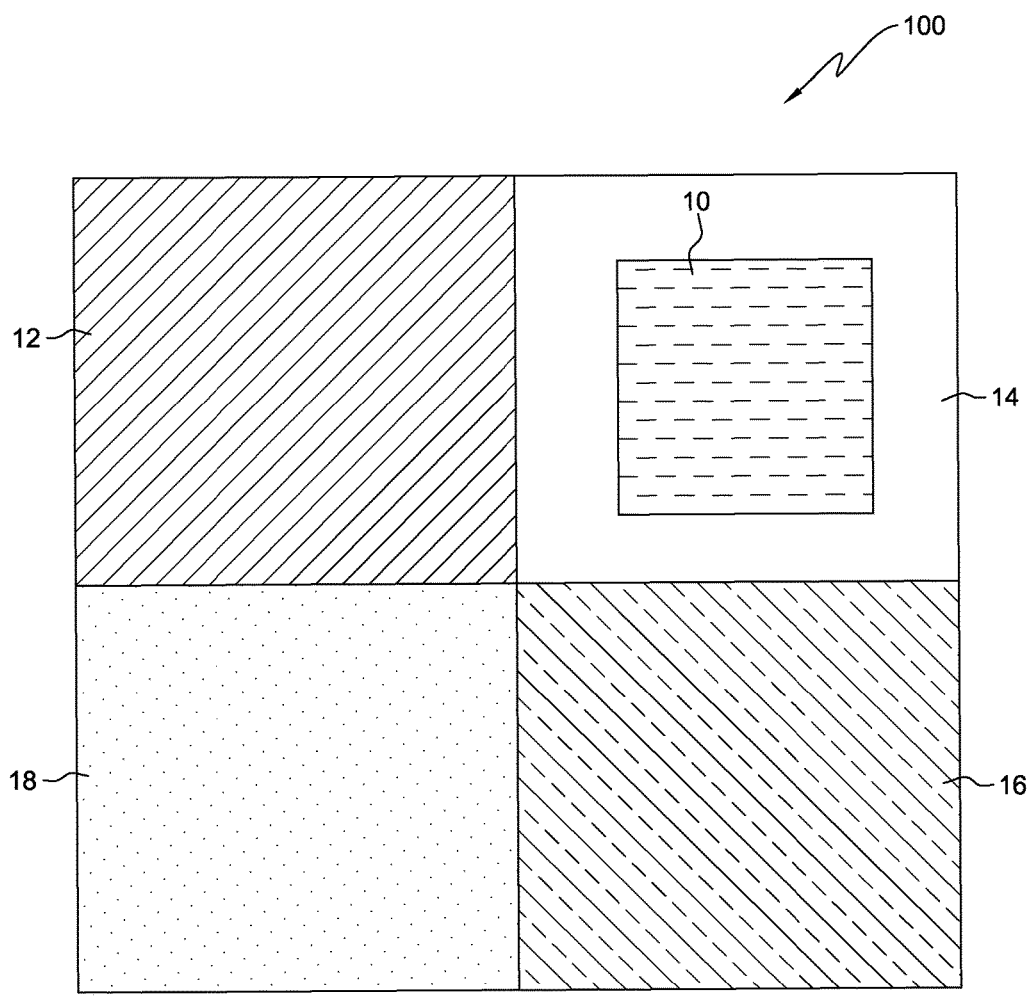
FIG. 1 is a top plan view of a laminate stack that has been segregated into four resin curing areas, in accordance with an exemplary embodiment.

In general, warpage refers to a bending or twist or general lack of flatness in the overall PCB, including in particular the plane formed by the solder joint locations formed with an IC package. Warpage can cause a variety of problems such as fractured solder joints, open contact solder joints, pillowed joints, or intermittent contact solder joints. The degree of warpage can be exacerbated by larger IC package sizes, and by elevated processing temperatures.

As trends in integrated circuit (IC) complexity are consistently in the direction of larger package sizes, and as production changes in the direction of lead free solders yield higher processing temperatures, the difficulties relating to PCB warpage become more apparent. It is important to note that the desired tolerance for flatness at and across the processing temperature range can be very high. For example, a PCB may have a permissible warpage as low as 0.05% across its operating temperature range.

Warpage is influenced by several factors such as the quantity of PCB pattern and dielectric layers, and the chips and structures, such as IC packages, used in components mounted on the board, all of which have different coefficients of thermal expansion (CTEs) and elasticity. Many newer products are often more susceptible to warpage because they are thinner and use smaller geometry than prior PCBs. The high melting point of a lead-free solder means the reflow temperature is often around 260 degrees C. This high melting point may lead to warpage from the differences in CTEs. Also, electronic equipment is being increasingly used in environments subject to rapid temperature change, such as in automotive applications.

For automotive equipment applications, PCB warpage has been a continuous problem. The automotive environment increases the chance of PCB warpage and solder bond cracking, since the PCB must often withstand repeated and rapid temperature variation. Recently, in an effort to maximize cabin space, automotive designers have been moving electronic equipment into the engine compartment. This factor, combined with the growing demand for higher-density mounting of electronic components, makes heat cycle testing for electronic components mounted at high density necessary at 105 degrees C. or even 125 degrees C., instead of 85 degrees C., which was once sufficient. In certain extreme cases, products may be required to withstand temperatures as high as 150 degrees C. for 2,000 or even 3,000 cycles.

In general, one of the most common methods to control PCB warpage is to use a symmetric design for PCBs, since asymmetric designs are often more prone to warpage. However, restrictions associated with symmetrical designs can severely complicate an otherwise simple PCB design and increase manufacturing costs. Another method to controlling warpage is to control the difference in the coefficients of thermal expansion of the IC package and PCB by varying material type and material quantity used. Again, the use of more expensive materials and/or additional material to maintain a symmetric design and reduce warpage can increase manufacturing costs.

The present invention will now be described in detail with reference to the Figures.

FIG. 1 depicts a laminate stack, 100, that has been segregated into four resin curing areas, herein respectively referred to as CTE area 12, 14, 16, and 18, in accordance with an exemplary embodiment. Typically, a laminate stack is a stack of layers composed of alternating circuit and insulating layers, which are laminated together to produce a printed circuit board (PCB). In general, each resin curing area has been assigned a target coefficient of thermal expansion, which is related to the degree of curing of the resin included in the respective area, which will minimize warpage of a PCB produced from laminate stack 100. While laminate stack 100 is depicted with four resin curing areas, namely CTE areas 12, 14, 16, and 18, any number of resin curing areas can be used to achieve the desired granularity in CTE for a given PCB produced from a respective laminate stack. Moreover, although the resin curing areas are depicted as rectangles, in other exemplary embodiments, any number of geometric shapes may be used for the resin curing areas.

In accordance with an exemplary embodiment, CTE area 14 of laminate stack 100 further includes land grid array (LGA) region 10. Land grid array (LGA) region 10 is the mounting region for an integrated circuit (IC) that is associated to the PCB produced from laminate stack 100. The heat produced by a functioning IC necessitates that the CTE of land grid array (LGA) region 10 of the laminate stack be lowered, respective to CTE area 12, 16, and 18, to minimize warpage of the finished PCB. In other words, as heat is generated, by a functioning IC in LGA region 10, the heat causes expansion respective to the CTE of LGA region 10. However, areas 12, 16, and 18 do not experience an increase in temperature and therefore do not expand in the same manner as LGA region 10. The difference in expansion between LGA region 10 and areas 12, 16, and 18 results in warpage of the PCB. Therefore, to counteract the warpage, the heating elements in the lamination press platens are adjusted to increase the localized temperature in CTE area 14 thereby increasing resin curing to achieve the desired CTE. In other embodiments, LGA region 10 can be the mounting area for a different component such as, a diode, a resistor, a transistor, a capacitor, an inductor, a microprocessor, and a semiconductor package.

In general, computer modeling can be used to predict warpage of a given PCB. Computer modeling can also be employed to predict the flow of resin with the PCB and resin bleed-out during the curing process. However, there are many alternative methods to predicting and/or identifying warpage as well as the areas of a PCB that can cause warpage. Determining a CTE for an area of a PCB can also be greatly aided by the application of computer modeling. Such an application can also generate specific cure conditions to generate CTEs that will produce a PCB with minimized warpage.

In general, to manufacture a PCB, circuit and insulating layers are laminated together in a press comprised of multiple platens. Generally, the alternating circuit layers and insulating layers are modified using one or more of laminating, patterning, masking, stripping, washing, electro-less metal plating, electrolytic metal plating, etching, cutting, drilling, filling an opening with a thermally conductive material, filling an opening with a thermally insulating material, filling an opening with an electrically conductive material, and filling an opening with an electrically insulating material. Such modifications can be made at multiple points during the fabrication process and can include other modifications not listed above.

Typically, platens are heated to drive thermal energy into the B-staged resin, of a laminate stack, to advance the cure to effectively fabricate a multilayer laminate. Traditionally, the platens would be uniformly heated to ensure uniform curing of the resin. Generally, the B-staged resin is typically converted to near completion, e.g., 95% cured. However, increased temperatures and/or dwell time can result in further cure advancement which, in turn, lowers the respective CTE. Embodiments of the present invention employ advancing the degree of curing in select areas of laminate stacks to lower CTEs and thereby minimize warpage of the PCB produced from the laminate stack.

The preferentially heating of various platen areas on either one or both sides of the laminate stack, e.g., the top layer and the bottom layer of a laminate stack, can advanced resin cure which, in turn, increases the crosslink density and drive the CTE lower for the heated area. By providing non-uniform heating to the platens, resin cure in specific locations of the laminate stack can be adjusted to yield a PCB with varying CTE.

Typically, lamination and resin curing are accomplished through the application of pressure and/or electromagnetic radiation, e.g., heat (infra-red radiation), to the resin included in a laminate stack. In an exemplary embodiment, the electromagnetic radiation used to advance resin curing includes electromagnetic radiation in the range of 300 GHz (microwave) to 750 THz (ultra-violet). However, in other embodiments, other forms of energy or curing may be applied to advance resin curing in a given laminate stack.

Figure 2:
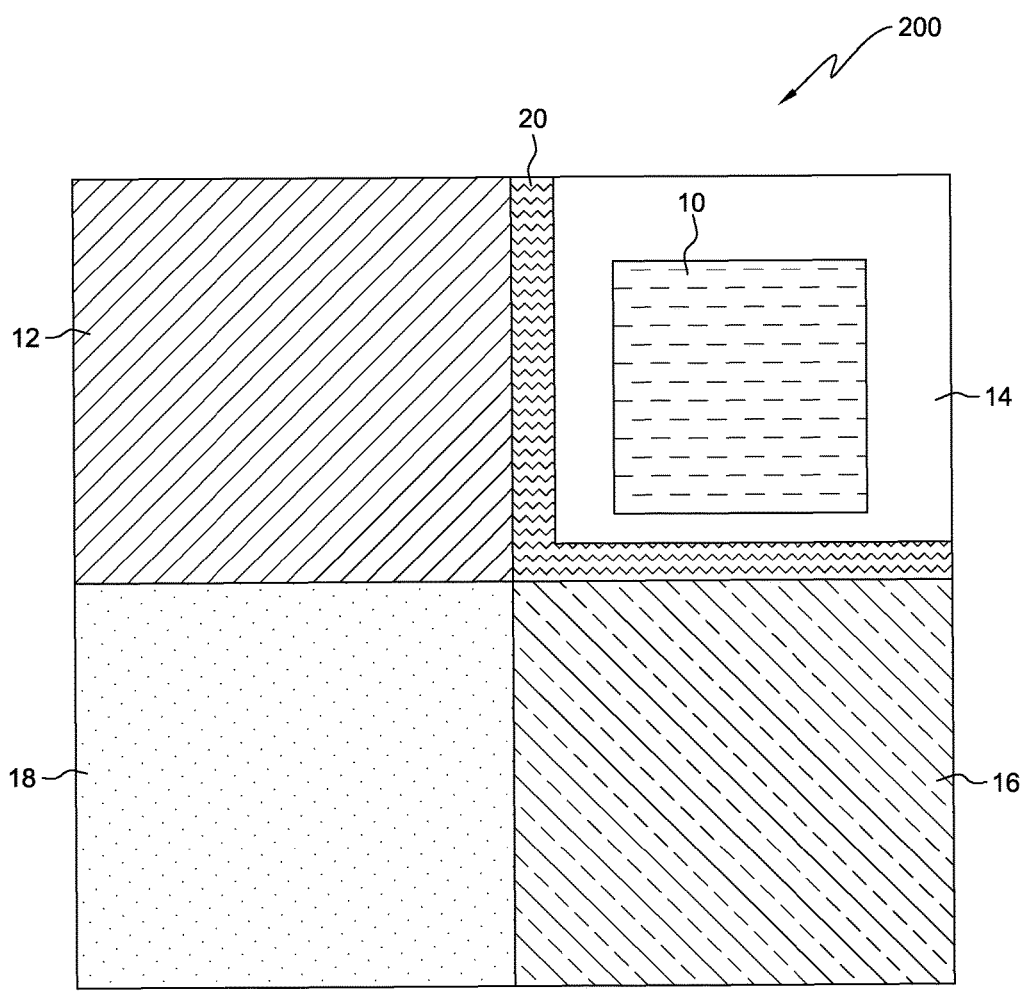
FIG. 2 is a top plan view of a laminate stack that includes insulating material, in accordance with an exemplary embodiment.

In this embodiment, FIG. 2 illustrates a laminate stack, 200. Laminate stack 200 is substantially similar to laminate stack 100 that further includes insulating material 20, which is juxtaposed between area 14 and areas 12, 16 and 18. Insulating material 20 is used to segregate one or more areas from other areas. In general, insulating material 20 slows the rate of energy transfer between areas exposed to extended or increased curing conditions, and those which are not. In alternative embodiments, insulating material 20 can be any material used to reduce undesired curing. In this embodiment, the boundary between CTE area 14 and CTE area 12, 16, and 18 is fabricated using a thermally insulating material to control heat transfer. Therefore, as CTE area 14 is exposed to additional heating, CTE area 12, 16, and 18 will, respectively, not experience a substantial increase in resin curing due to heat transfer.

In general, platen temperature is controlled to the material recommendations for both temperature set point and ramp rate. For example, LGA region 10 requires a lower CTE than areas 12, 16 and 18. As such, the temperature of the platen compartment that corresponds to and will control the curing of LGA region 10 can be increased or the dwell time at the temperature set point may be increased, respective to, for example, the material manufacturer's recommendations, to drive resin cure over 95%. In the above example, increased cure temperature or dwell time results in a localized reduction of the CTE in LGA region 10.

In an alternative embodiment, selective heating of specific areas can be used to control resin flow during curing. In general, as resin is heated the associated viscosity of the resin decreases. The loss of viscosity can lead to resin "bleed-out" as temperature and pressure are increased. However, careful control of cure conditions for the resin located at and near the perimeter of the laminate stack can reduce resin bleed-out. For example, the perimeter of the laminate stack up may be cured more slowly at a lower temperature for an extended period of time, compared to the interior of the laminate stack, in order to prevent resin bleed-out around the edges of the laminate stack. This can leave more resin available to fill the low pressure areas within the PCB. In some scenarios, only a portion of a perimeter is prone to resin bleed-out and therefore only a select portion of the perimeter requires slow curing at a lower temperature for an extended period of time.

Figure 3:
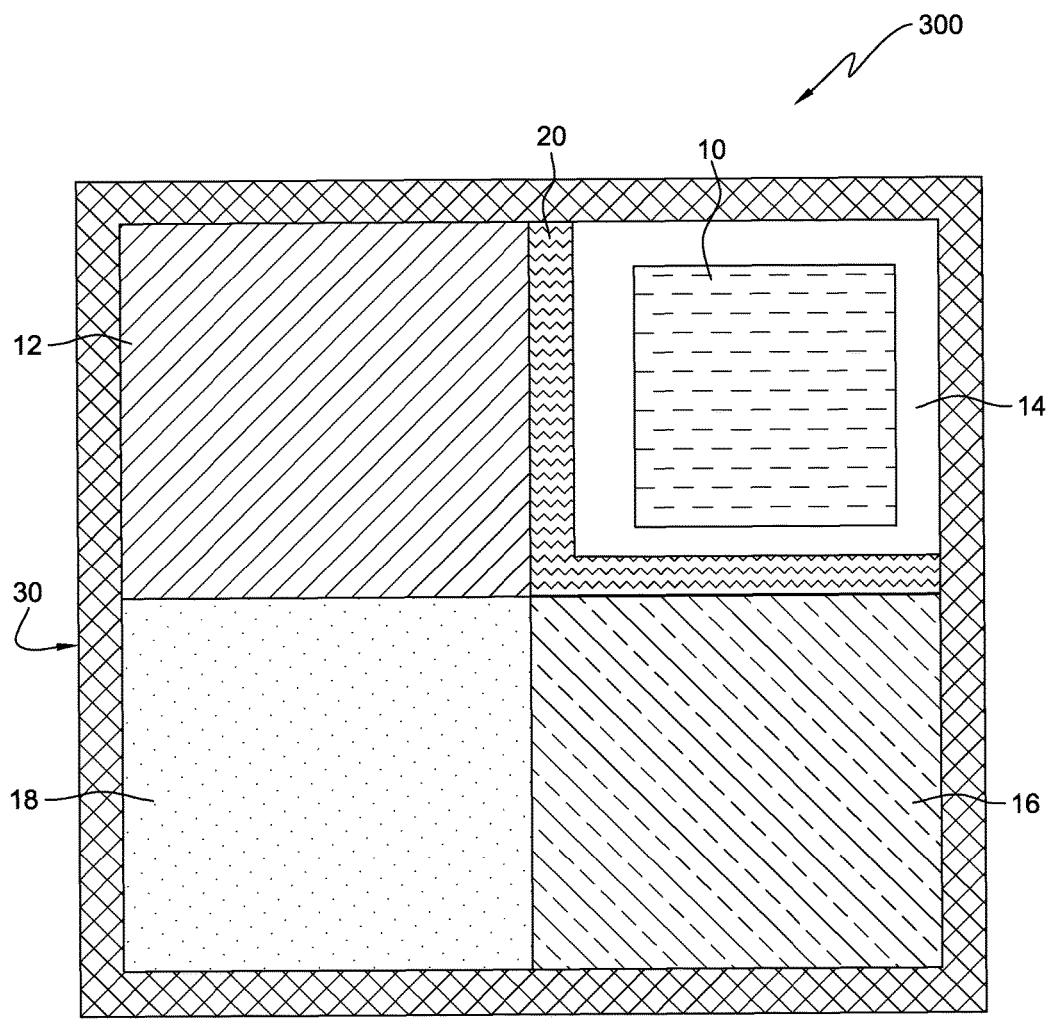
FIG. 3 is a top plan view of a laminate stack that includes a resin cure area to control resin bleed-out, in accordance with an embodiment of the present invention.

In an exemplary embodiment, FIG. 3 illustrates a laminate stack, 300. Laminate stack 300 is substantially similar to laminate stack 200 that further includes a resin cure area 30 to control resin bleed-out. Resin cure area 30 follows the entire perimeter of the laminate stack. During the curing process, resin cure area 30 is heated more slowly and for an extended period of time compared to the rest of the laminate stack 300. In general, during the curing process, the slow heating of resin allows the viscosity of the resin to remain at a sufficient magnitude, to reduce bleed-out. In some embodiments, there may be multiple segments or areas where resin bleed-out is a concern.

By utilizing multiple resin cure area 30, the flow of resin can be controlled within the laminate stack itself. For example, there may be a specific section of the laminate stack where it is desirable to have additional resin thickness, e.g., a section that includes an LGA, and as such contains more resin than other areas of the laminate stack. By surrounding such a section with resin cure area 30 the resin can be prevented from flowing out. In another example, resin cure area 30 only partially surrounds a section of the laminate stack to direct the flow of resin during the curing process. As the laminate stack is heated, resin is prevented from flowing out through resin cure area 30 thereby controlling the resin flow. Such a resin cure area 30 can take the form of one or more lines or geometric shapes, which can be located according to the desired flow of resin.

Figure 4:
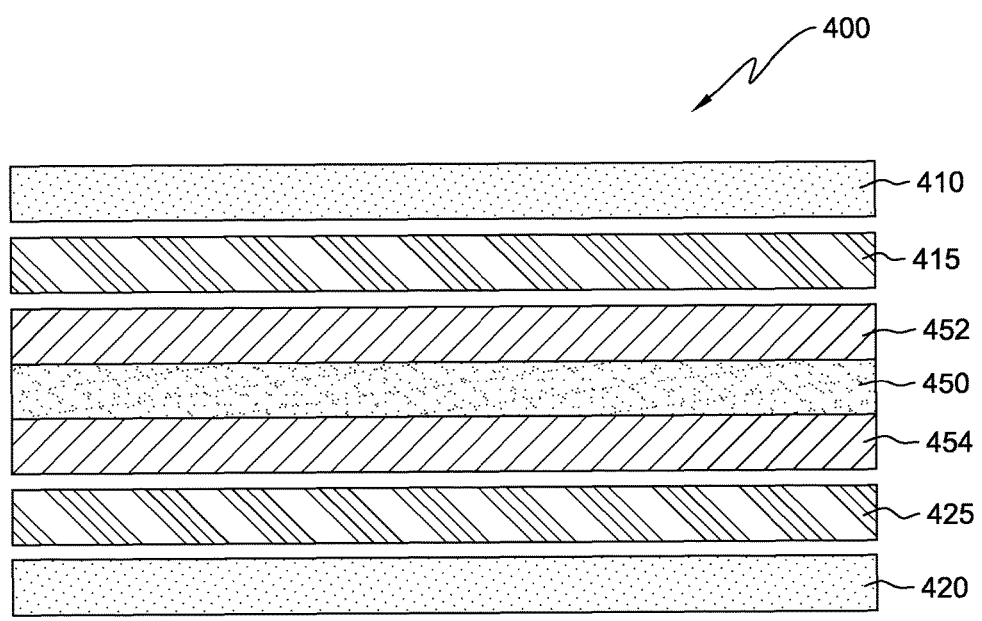
FIG. 4 is an exploded cross-sectional view of a laminate stack, in accordance with an exemplary embodiment.

FIG. 4 is an exploded cross-sectional view of a laminate stack, 400, in accordance with an exemplary embodiment. In FIG. 4, to aid in differentiation between the layers, the layers of laminate stack 400 are shown as separated. However, the layers of a given laminate stack 400 are, typically, in respective physical contact with one another. In general, laminate stack 400 is a four-layer board, i.e., a type of multi-layer PCB. Laminate stack 400 includes an inner rigid core, with two layers of B stage PrePeg fiberglass, 415 and 425, and two layers of copper foil, 410 and 420. The top layer, i.e., the top side, of laminate stack 400 is herein defined as the layers including B stage PrePeg fiberglass 415 and copper foil 410. The bottom layer, i.e. the bottom side, of laminate stack 400 is herein defined as the layers including B stage PrePeg fiberglass 425 and copper foil 420.

In accordance with an exemplary embodiment, an inner rigid core, such as an FR-4 core, is composed of three layers, namely a flame retardant fiberglass reinforced epoxy laminate 450, and two copper layers, 452 and 454 respectively. Typically, circuitry is etched into copper layers, 452 and 454, to produce a simple printed circuit board. However, a more complex printed circuit board can be produced by including additional layers in the laminate stack, e.g., layers 415, 425, 410, and 420.

In general, B stage PrePreg fiberglass 415 and 425, is fiberglass that is still soft, i.e., needing to be heated in order to become rigid. Typically B stage PrePreg fiberglass is used as an adhesive layer to keep the inner rigid core adhered to outer copper layers, e.g., 410 and 420. The inner rigid core is usually processed to create traces (the wires of the PCB) on copper layers 452 and 454 prior to the addition of B stage PrePeg fiberglass 415 and 425, and copper foil, 410 and 420. Once all the desired layers have been assembled, the entire board is laminated together.

In an alternative embodiment, the top layer of a laminate stack can be heated differentially relative to the bottom layer in order to control PCB warpage. The differential heating can be tailored for the board design (i.e., copper density, heat capacity, and other design features) to optimize resin curing to minimize PCB warpage. For example, the top side of laminate stack 400 is heated more quickly than the bottom side of laminate stack 400, i.e., B stage PrePeg fiberglass 415 is heated more quickly than B stage PrePeg fiberglass 425. The differential heating causes B stage PrePeg fiberglass 415 to cure to a higher degree than B stage PrePeg fiberglass 425. The resulting difference in curing generates in a difference in CTE for the top of the resulting PCB when compared to the bottom of the PCB.

By applying differential heating to various areas and/or layers of a laminate stack, an asymmetric PCB or symmetric PCB, can be fabricated that has a non-uniform CTE, which imparts a reduced degree of warpage.

Having described exemplary embodiments of creating printed circuit boards with reduced warpage (which are intended to be illustrative and not limiting), it is noted that modifications and variations may be made by persons skilled in the art in light of the above teachings. As such, embodiments of the present invention may be used in a variety of electronic applications that include printed circuit boards and related structures.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later come to be known to those of ordinary skill in the art are expressly incorporated herein by reference and intended to be encompassed by the invention. It is therefore to be understood that changes may be made in the particular embodiments disclosed which are within the scope of the present invention as outlined by the appended claims.

Each respective figure, in addition to illustrating the structure of the present invention at various stages and configurations, also illustrates the respective steps of the method for the fabrication/manufacture of printed circuit boards with minimized warpage.

What is claimed is:

1. A method of fabricating an asymmetric printed circuit board with reduced warpage, the method comprising:
    creating a stack of layers, wherein the stack of layers includes a top layer and a bottom layer;
    determining a first area and a second area of the stack of layers;
    determining a first target coefficient of thermal expansion for the first area and a second target coefficient of thermal expansion for the second area based, at least in part, on an amount of heat that is predicted to be produced by at least one circuit component;
    identifying, in the stack of layers, a portion of the first area and a portion of the second area that include resin; and
    generating the asymmetric printed circuit board, at least in part, by differentially applying at least one of (i) electromagnetic radiation and (ii) pressure to each of (a) the portion of the first area based on the first target coefficient of thermal expansion and (b) the portion of the second area based on the second target coefficient of thermal expansion, thereby increasing curing of resin included in the portion of the first area and the portion of the second area, wherein (i) a degree of curing in the first area is different than a degree of curing in the second area, and (ii) at least one of an amount of electromagnetic radiation and an amount of pressure applied to areas that include resin are based, at least in part, on at least one of a recommended set point for the resin, dwell time for the resin, ramp rate for the resin, and warpage predicted by computer modeling.

2. The method of claim 1, wherein an increase in the degree of curing of the resin included in the stack of layers results in a change in a coefficient of thermal expansion for at least the portion of the first area that includes resin.

3. The method of claim 1, wherein the stack of layers is comprised of alternating circuit layers and insulating layers.

4. The method of claim 3, wherein the alternating circuit layers and insulating layers are compressed together.

5. The method of claim 3, wherein at least one of the alternating circuit layers and insulating layers are modified using one or more of laminating, patterning, masking, stripping, washing, electro-less metal plating, electrolytic metal plating, etching, cutting, drilling, filling an opening with a thermally conductive material, filling an opening with a thermally insulating material, filling an opening with an electrically conductive material, and filling an opening with an electrically insulating material.

6. The method of claim 4, wherein at least one of electromagnetic radiation and pressure is applied to at least one of the alternating circuit layers and insulating layers before the alternating circuit layers and insulating layers are compressed together, and wherein the applied electromagnetic radiation includes one or more frequencies included in the range of 300 GHz (microwave) to 750 THz (ultra-violet).

7. The method of claim 1, the method further comprising the steps of:
    identifying a perimeter of the first area, wherein the perimeter contains resin; and
    applying at least one of electromagnetic radiation and pressure to at least a portion of the perimeter, thereby increasing the degree of curing of the resin included in the portion of the perimeter.

8. The method of claim 7, wherein the increased degree of curing of the resin included in the portion of the perimeter controls, at least in part, the flow of resin within the stack of layers.

9. The method of claim 7, wherein the amount of electromagnetic radiation and pressure applied to the portion of the perimeter are based, at least in part, on at least one of a recommended set point for the resin, dwell time for the resin, ramp rate for the resin, warpage predicted by computer modeling, and a flow of resin predicted by computer modeling, and wherein the applied electromagnetic radiation includes one or more frequencies included in the range of 300 GHz (microwave) to 750 THz (ultra-violet).

10. The method of claim 1 further comprising the step of:
    applying different amounts of electromagnetic radiation to both of the top layer and the bottom layer of the stack of layers, wherein the application of the electromagnetic radiation changes the degree of curing of resin respective to the top layer and the bottom layer of the stack of layers, wherein a respective degree of curing of resin generates a coefficient of thermal expansion of the top layer that is different than a coefficient of thermal expansion of the bottom layer.

11. The method of claim 10, wherein the amount of electromagnetic radiation applied to at least one of the top layer and the bottom layer of the stack of layers is based, at least in part, on one or more of a recommended set point for the resin, dwell time for the resin, ramp rate for the resin, and warpage predicted by computer modeling, and wherein the applied electromagnetic radiation includes one or more frequencies included in the range of 300 GHz (microwave) to 750 THz (ultra-violet).

12. The method of claim 1, wherein the first area and the second area are separated, at least in part, by an insulating material.

13. The method of claim 1, wherein the top layer and the bottom layer of the stack of layers are separated, at least in part, by a layer of insulating material.

14. The method of claim 1, wherein the applied electromagnetic radiation includes one or more frequencies included in the range of 300 GHz (microwave) to 750 THz (ultra-violet).

* * * * *